United States Patent [19]

LeMaitre et al.

[11] Patent Number: 4,896,115
[45] Date of Patent: Jan. 23, 1990

[54] ELECTRICAL NETWORK INSULATION MONITORING AND MEASURING DEVICE

[75] Inventors: Philippe LeMaitre; Philippe Schuster; Christian Pellegrin, all of Grenoble, France

[73] Assignee: Merlin Gerin, France

[21] Appl. No.: 201,014

[22] Filed: Jun. 1, 1988

[30] Foreign Application Priority Data

Jun. 4, 1987 [FR] France .................. 87 07871

[51] Int. Cl.$^4$ .......................................... G01R 31/02
[52] U.S. Cl. .................................. 324/551; 324/509; 324/541
[58] Field of Search ............... 324/509, 510, 519, 522, 324/525, 527, 539, 541, 548, 551, 552, 554, 60 R, 60 C, 62; 340/650, 651; 361/42

[56] References Cited

U.S. PATENT DOCUMENTS

| | | | |
|---|---|---|---|
| 3,976,987 | 8/1976 | Anger | 324/509 |
| 4,142,143 | 2/1979 | Daniel | 324/527 X |
| 4,200,835 | 4/1980 | Anahara et al. | 324/509 |
| 4,206,398 | 6/1980 | Janning | 324/509 |
| 4,335,348 | 6/1982 | Reed et al. | 324/538 |
| 4,422,034 | 12/1983 | Matsuno et al. | 324/541 |
| 4,472,676 | 9/1984 | Eichmann et al. | 324/509 |
| 4,791,375 | 12/1988 | Kan | 324/552 |

FOREIGN PATENT DOCUMENTS

| | | |
|---|---|---|
| 0033858 | 8/1981 | European Pat. Off. . |
| 0083306 | 7/1983 | European Pat. Off. . |
| 2542811 | 11/1976 | Fed. Rep. of Germany . |
| 2545325 | 4/1977 | Fed. Rep. of Germany . |
| 1586914 | 3/1970 | France . |

Primary Examiner—Reinhard J. Eisenzopf
Assistant Examiner—Jack B. Harvey
Attorney, Agent, or Firm—Arnold, White & Durkee

[57] ABSTRACT

An insulation monitoring device comprises an input circuit of a reference AC signal, and an electronic detection circuit for discriminating the components of a measurement signal proportional to the ground fault impedance Z formed by a leakage resistor Rf in parallel with a leakage capacitor C. A synchronous detector has a pair of static inverters processing the first component, which is a function of the current IR flowing through the leakage resistor Rf, and of the second component which is a function of the current IC flowing through the capacitor C. A converter cooperates with the generator to deliver two quadrature signals C1 and C2 to respectively control the inverters. A display means accurately displays the value of the leakage resistance Rf.

5 Claims, 3 Drawing Sheets

ELECTRICAL NETWORK INSULATION MONITORING AND MEASURING DEVICE

BACKGROUND OF THE INVENTION

The invention relates to a monitoring and measuring device of the insulation of an electrical network with respect to earth, comprising an input circuit of a reference AC signal to the network to be monitored, and an electronic detection circuit designed to supply a measurement signal significant of the insulation status of the network in reply to the sending of the reference signal, said measurement signal being proportional to the ground fault impedance Z formed by a leakage resistor Rf, and a leakage capacitor C whose capacitance depends on the characteristics of the electrical network, the detection circuit comprising discrimination means of the components of said measurement signal, having a first component being a function of the current IR flowing through the leakage resistor Rf, and a second component being a function of the current IC flowing through the leakage capacitor C.

According to a prior art device, a generator can input a low frequency reference AC voltage to the electrical network via a filter. The leakage current flowing in the ground loop circuit is measured at the terminals of a measuring resistor. The voltage at the terminals of the measuring resistor constitutes in fact the image of the sum of the first partial current via the leakage resistor Rf, and of the second partial current via the leakage capacitor of the network. Direct measurement of the insulation at the terminals of the measuring resistor consequently gives a wrong indication of the insulation status of the electrical network. An auxiliary compensating circuit in some cases enables the influence of the leakage capacitance of the network to be taken into account, but correction of the measurement assumes that the value of this capacitance is previously known. It is difficult to calculate the value of this leakage capacitance accurately as it varies greatly with the configuration of the network to be monitored, notably according to the number of feeders in operation. The voltage measurement at the terminals of the measuring resistor is furthermore often disturbed by interference generated by radiation or conduction over a very wide frequency range. This state-of-the-art insulation monitoring principle can only be applied to a network with isolated neutral.

The document FR 1,586,914 also illustrates measurement of the electrical network insulation by applying a current of a frequency lower than that of the network, and by distinguishing the current flowing respectively through the leakage resistor and capacitance. Electronic detection circuits however remain complicated and are subject to the influence of interference which can give a wrong indication of the insulation status.

The object of the invention is to achieve an insulation monitoring and measuring device protected from interference, and capable of giving a reliable indication of the insulation status of the network regardless of the neutral system chosen, and of the leakage capacitance of the network.

SUMMARY OF THE INVENTION

The discrimination means of the detection circuit according to the invention comprise a synchronous detection device having a pair of static inverters processing the first and second components of the measurement signal, and a converter designed to deliver two quadrature signals C1 and C2 to respectively control the two inverters, the first control signal C1 being in phase with the reference AC signal input to the electrical network by the input circuit.

Interference is eliminated by means of a filtering circuit designed to deliver a filtered signal at the frequency of the reference AC signal, and cooperating with an amplifier circuit arranged to supply two amplified opposite phase signals S1 and S2, applied respectively to a break contact and a make contact of each inverter.

Double synchronous detection is thus capable of breaking down the signal which is the image of the ground fault impedance Z into two perpendicular components:

one IZ cos a being aligned with the reference voltage to calculate the leakage resistance Rf.

the other IZ sin a in quadrature with the first to calculate the leakage capacitance.

The output of each inverter is connected to an integrating circuit capable of extracting the mean value of the first and second components of the measurement signal.

According to a first embodiment of the monitoring device applied to an electrical network with IT neutral system, the reference AC signal is input to the network by means of a generator via connecting capacitors. The measurement signal is taken at the terminals of a measuring resistor inserted in series with the generator and the ground fault impedance.

According to a second embodiment of the monitoring device applied to an electrical network with TN or TT neutral system, the reference AC signal is input to the network by means of a first excitation toroid surrounding the phase conductors R, S, T of the network and having a primary winding connected to a generator. The measurement signal representing the image of the ground fault impedance Z of the network is taken at the terminals of a secondary winding wound on a second measuring toroid surrounding the same conductors of the network.

BRIEF DESCRIPTION OF THE DRAWINGS

Other advantages and features will become more clearly apparent from the following description of a various illustrative embodiments of the invention, given as non-restrictive examples only and represented in the accompanying drawings, in which.

DESCRIPTION OF THE PREFERRED EMBODIMENT

Figures 1, 2:
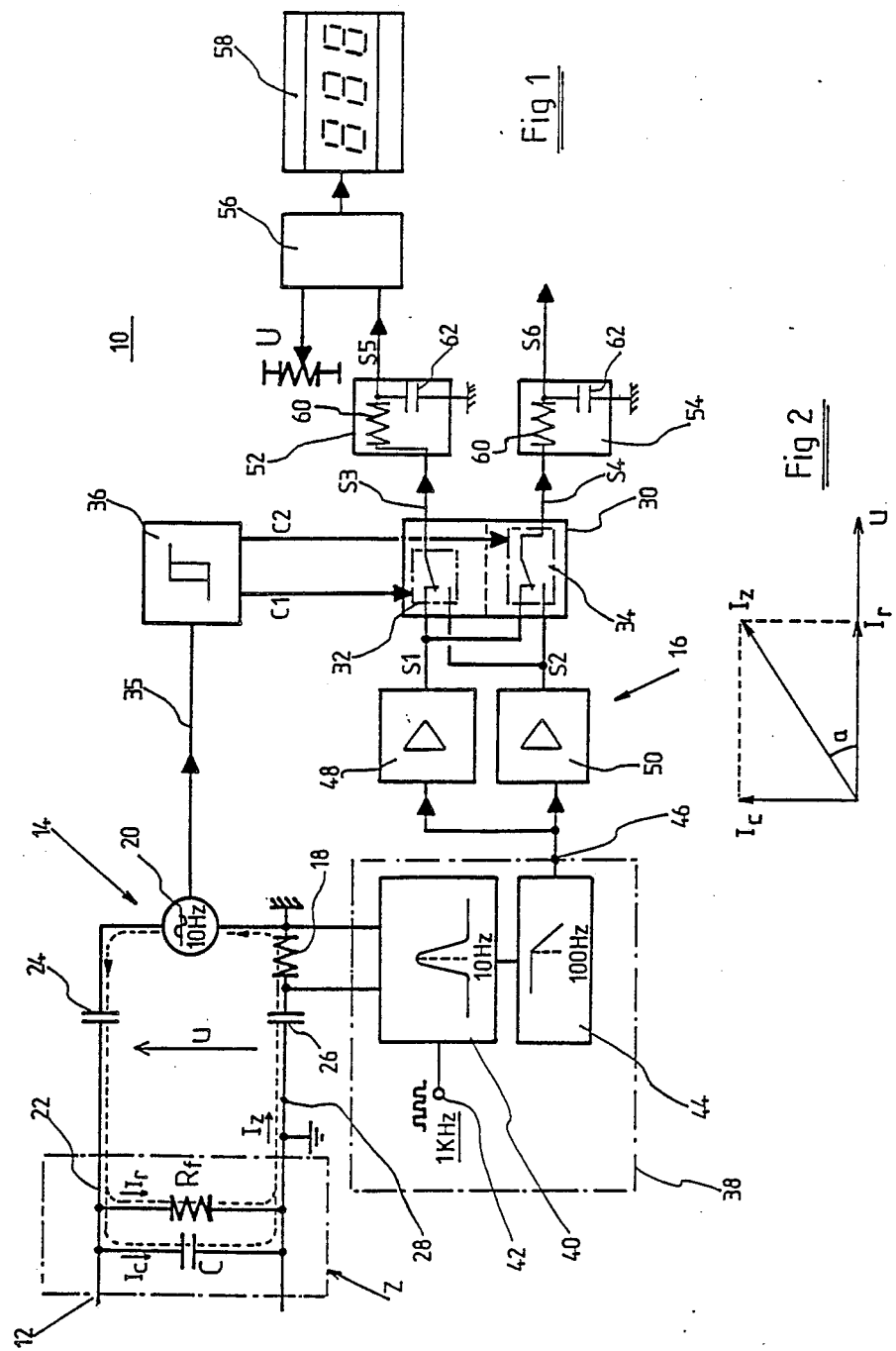
FIG. 1 is a block diagram of the insulation monitoring and measuring device according to the invention.
FIG. 2 shows the vector representation of the current flowing through the ground fault impedance.
Figure 3:
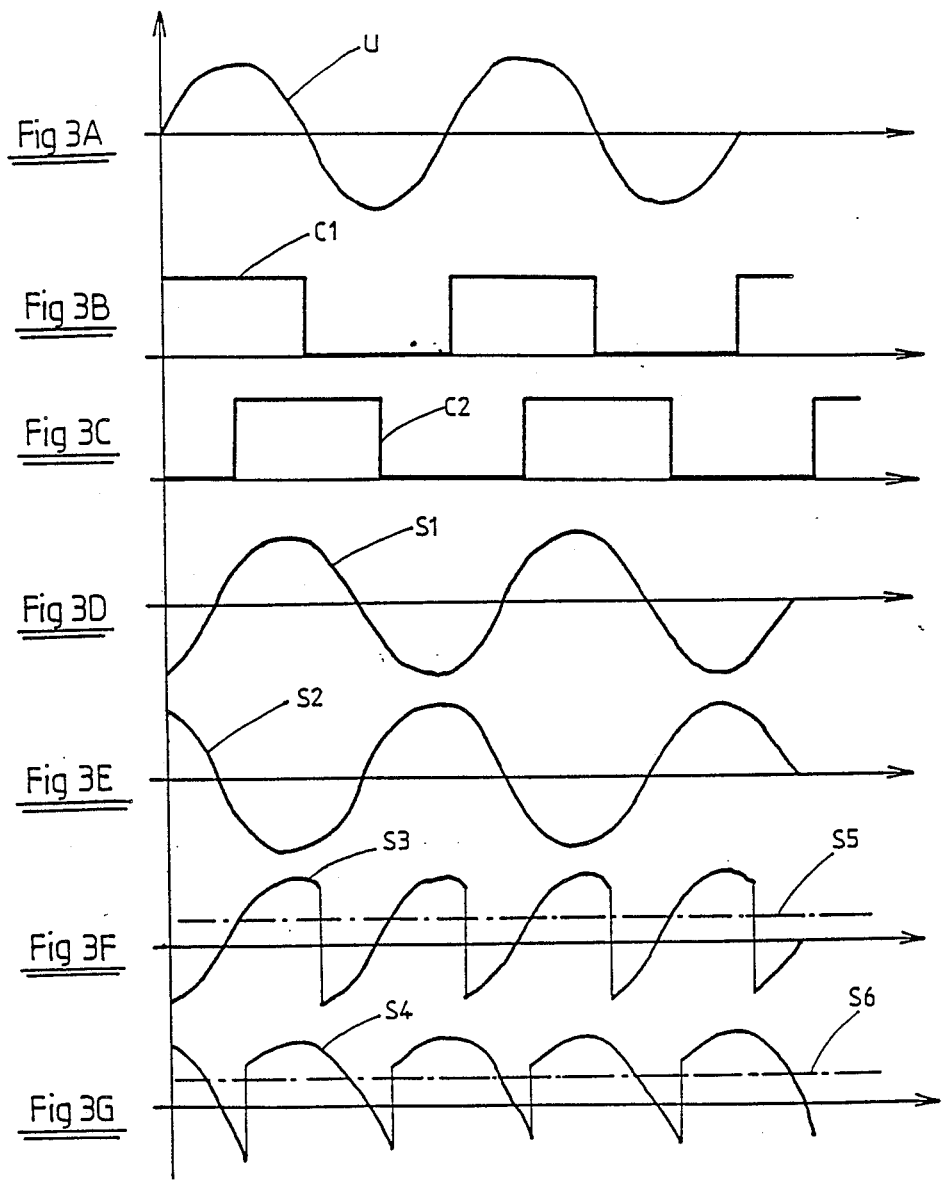
FIGS. 3A to 3G illustrate the electrical signals at different points of the diagram in FIG. 1.

In FIGS. 1 to 3, the monitoring device 10 of the insulation of an AC or DC electrical network 12 comprises an input circuit 14 of a low frequency AC signal, and an electronic detection circuit 16 of the leakage current IZ flowing through a measuring resistor 18. The neutral system of the network 12 is of the isolated neutral IT type, the frame of the electrical installation being connected to earth. The input circuit 14 comprises a generator 20 capable of applying an AC test voltage u with a frequency of 10 Hz to the network (see FIG. 3A). The AC network 12 could naturally comprise several conductors (three-phase or without neutral). The electrical network 12 could also be constituted by a DC network. The ground fault impedance Z is formed by a leakage resistor Rf electrically connected in parallel with a leakage capacitor C whose capacitance depends on the characteristics of the network 12, notably on the length of the phase conductor 22. The frequency of the AC network 12 can be 50 Hz, 60 Hz, or 400 Hz and it is imperative that the frequency of the test voltage u of the generator 20 be lower than the frequency of the network 12. The use of a low frequency for the test voltage u enables very small phase differences in the order of a degree to be displayed at the end of the channel, and the current intensity IC flowing in the leakage capacitor C to be minimized.

In the case of a DC network 12, one of the terminals of the generator 20 is connected to the conductor 12 by means of a first connecting capacitor 24. The opposite terminal of the generator 20 is connected to the ground of the device 10, and to one of the terminals of the measuring resistor 18. A second connecting capacitor 26 is inserted between the measuring resistor 18, and a conductor 28 electrically connected to earth. The input circuit 14 forms a closed loop in which the measuring resistor 18 is connected in series with the ground fault impedance Z. The voltage at the terminals of the measuring resistor 18 constitutes the image of the current IZ representing the vector sum of the currents IC and IR (FIG. 2) flowing respectively through the leakage capacitor C and the leakage resistor Rf.

In the case of an AC network 12, the generator 20 of the input circuit 14 is connected to the network 12 by a filter (not shown). The principle of the electronic detection circuit 16 consists in processing the signal IZ to make the discrimination between the partial currents IR and IC. Insulation monitoring entails measuring the ground fault impedance Z, and extracting therefrom the actual value of the leakage resistance Rf which satisfies the following relationship (1):

(1) $Rf = Z \cos a$, a being the phase difference between the current IZ flowing through the impedance and the voltage u. This results according to FIG. 2 in the current IR flowing through the leakage resistor Rf being determined by the relationship (2):

(2) $IR = IZ \cos a$,

IR being in phase with the reference voltage u at the terminals of the impedance Z, and the current IC flowing through the leakage capacitor C being given by the relationship (3):

(3) $IC = IZ \sin a$,

IC being in quadrature with IR.

To achieve separation of the signal into two quadrature components according to the relationships (2) and (3), the electronic detection circuit 16 advantageously comprises a synchronous detector device 30, for example of the GAT 01 integrated type from Precision Monolithics Incorporated, containing two identical static inverters 32, 34, one 32 to process the IZ cos a signal concerning the current IR in the leakage resistor Rf, the other 34 to process the IZ sin a signal of the relationship (3). The inverters 32, 34 can also be CMOS components from Analog Device ADG 201 A.

The generator 20 is connected by a line 35 to a converter 36 capable of transforming the 10 Hz AC voltage into two square signals C1 and C2 (FIGS. 3B and 3C) of the same frequencies, designed for control of the two inverters 32, 34 of the synchronous detector 30. The first square signal C1 (FIG. 3B) is in phase with the input voltage u (FIG. 3A), and controls the inverter 32 processing the current IR used to calculate the leakage resistance Rf. The second square signal C2 (FIG. 3C) of the converter 36 is dephased 90 degrees in relation to the input signal u or to the first square signal C1, and controls the other inverter 34 processing the current IC to calculate the capacitance of the leakage capacitor C of the network 12.

The voltage present at the terminals of the measuring resistor 18 is applied to a filtering circuit 38 designed to eliminate the interference voltages and other disturbances of the network 12. The filtering circuit 38 is equipped with a first input filter 40 capable of allowing the 10 Hz frequency AC voltage to flow, and having an additional high-frequency sampling control terminal 42. The 10 Hz voltage at the output of the first filter 40 is thus chopped at a frequency of 1 kHz. The chopping is then eliminated by the action of a second 100 Hz filter 44, whose output 46 delivers a sinusoidal signal at the frequency of 10 Hz proper.

The signal filtered at 10 Hz coming from the filtering circuit 38 is input to two amplifiers 48, 50 arranged to supply two alternating amplified signals S1 and S2 of opposite phase (see FIGS. 3D and 3E), and of the same frequency as the input voltage u. The two signals S1 and S2 are applied respectively to a break contact and to a make contact of each inverter 32, 34, whose common is electrically connected to an integrating circuit 52, 54 which extracts the mean value of the signal.

The output signal S3 and S4 (see FIGS. 3F and 3G) of each inverter 32, 34 is thus integrated separately to obtain the mean value S5 and S6 corresponding respectively to IZ cos a and IZ sin a. The output signal S5 from the integrator 52 is then input to an analog processing circuit 56 arranged to perform the relation between the value of the input voltage u and that of the current IR (i.e. IZ cos a) to determine the value of the leakage resistance Rf. The value of Rf is displayed by a display device 58, notably digital with light-emitting diodes or liquid crystals, or can be transmitted to a data bus (not shown).

The other output signal S6 from the integrator 54 can also be processed in a processing circuit (not shown) to calculate the current IC and display the capacitance of the leakage capacitor C. The phase difference between the currents IR and IC can also be determined from the signals S5 and S6.

Operation of the electrical network insulation monitoring device 10 according to FIGS. 1 and 2 can be clearly understood from the foregoing description, and it is sufficient to recall that the signal S3 generated to calculate the leakage resistance Rf by means of the synchronous detector 30 comes from the inverter 32 controlled by the first square signal C1 of the converter 36, said signal being in phase with the input voltage u. It can be noted in FIG. 3D that the signal S1 at the output of the amplifier 48 is more or less dephased in relation to the first square signal C1 depending on the capacitance value of the leakage capacitor C.

The signal S4 to determine the capacitance of the leakage capacitor C of the ground fault impedance Z is delivered by the inverter 34 controlled by the second square signal C2 dephased 90 degrees with respect to the first signal C1 from the converter 36.

Each integrating circuit 52, 54 can be formed by a resistor 60 and capacitor 62 circuit having a time constant greater than 0.1 seconds. The resistor 60 is fitted in series between the respective output of the inverter 32, 34 and the input of the analog processing circuit 56. The capacitor 62 is connected in parallel between the input of the circuit 56 and the ground.

Figure 4:
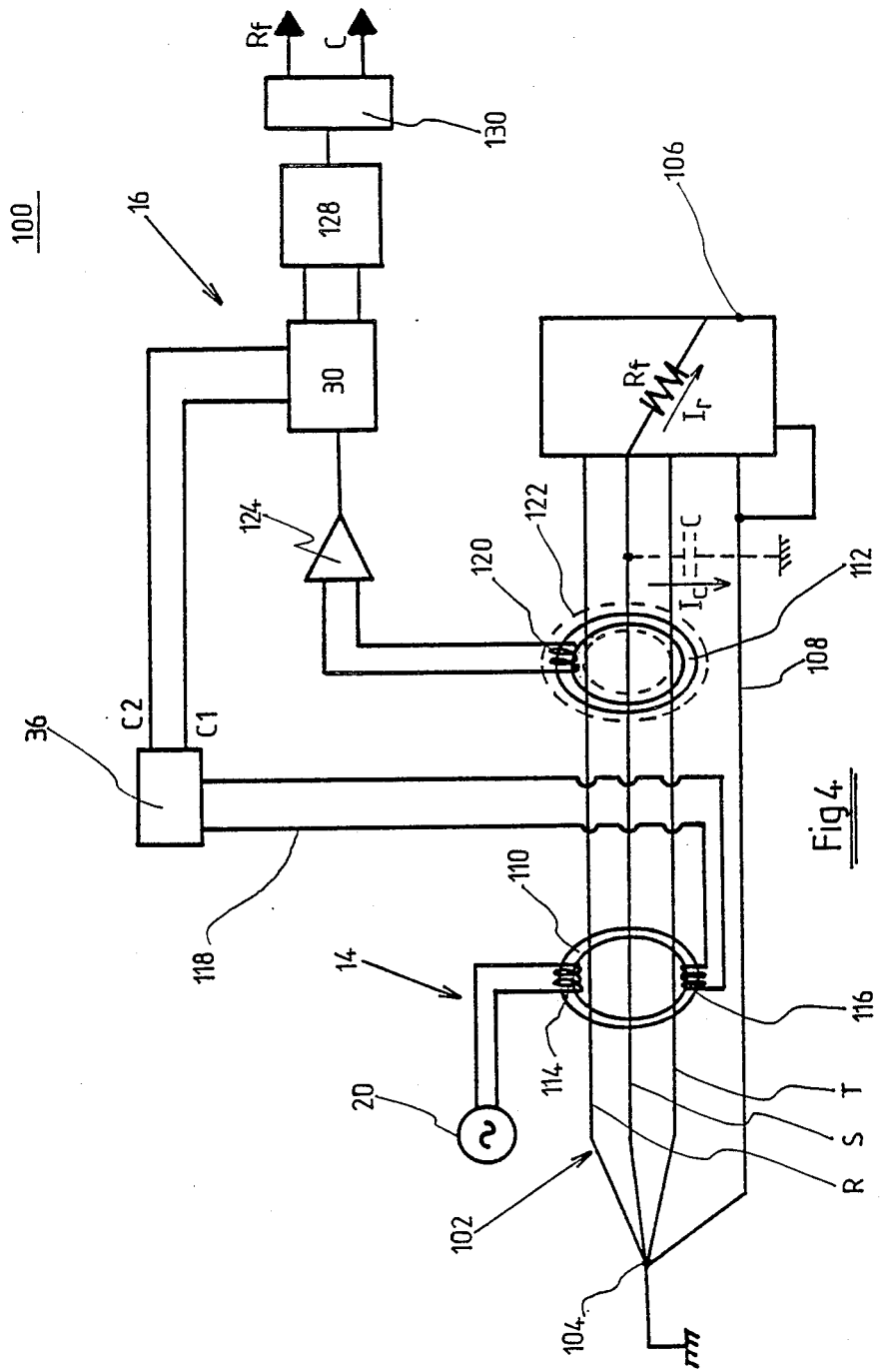
FIG. 4 is an alternative embodiment of the device in FIG. 1.

According to the second embodiment in FIG. 4, the same reference numbers will be used to designate identical components to those of the device in FIGS. 1 to 3. The insulation monitoring device 100 is applied in this case to a three-phase network 102 with TN neutral system, in which the neutral point 104 is earthed, and the frame 106 of the electrical installation is connected to the potential of the neutral conductor 108. The role of the monitoring device 100 consists in applying a reference current to the network 102 to be monitored, and in receiving an output signal significant of the insulation status of this network.

These two operations are performed without disconnecting the conductors of the network 102 by means of a system with two magnetic circuits in the form of toroids 110, 112. The first excitation toroid 110 is part of the input circuit 14, and surrounds the three phase conductors R, S, T of the three-phase network 102. The 10 Hz frequency AC voltage generator 20 is connected to a primary winding 114 wound on the first toroid 110, which constitutes a voltage transformer designed to create a potential difference of 10 Hz frequency in the network 102. In order to prevent interference phase displacements resulting notably from the losses in the material making up the first toroid 110, the latter is equipped with an auxiliary winding 116 capable of supplying the reference voltage which is in phase with the voltage actually applied to the network. This phase reference at the terminals of the auxiliary winding 116 is sent to the converter 36 by the connecting line 118. According to an alternative embodiment, the reference voltage can be taken directly at the terminals of the generator 20.

The second measuring toroid 112 is part of the detection circuit 16, and also surrounds the phase conductors R, S, T acting as a current transformer. A secondary winding 120 is wound for this purpose on the second toroid 112, and supplies a signal whose amplitude and phase represent the image of the ground fault impedance Z of the network. The sensitivity of this second toroid 112 is very high, and a shielding 122 can surround the toroid 112 to protect against interference and external magnetic fields.

The measurement signal at the terminals of the secondary winding 120 of the second toroid 112 is processed by the synchronous detector 30 after amplification in an accentuator 124. Operation of the synchronous detector 30 is identical to that of the device in FIGS. 1 to 3, and is controlled by the two square quadrature signals C1, C2 from the converter 36. The synchronous detector 30 is associated with a computation circuit 128 of the actual and imaginary components of the measurement signal, representing the value of the leakage resistance Rf and of the capacitance of the leakage capacitor C of the network. These values are then displayed on a display 130, as is the phase difference between the currents IR and IC.

The insulation monitoring device 100 according to FIG. 4 can naturally be used in a multiple AC network having a TT neutral system wherein the neutral point 104 is earthed, and the frame 106 of the electrical installation is connected directly to earth, or to an earthing conductor.

We claim:

1. A monitoring and measuring device of the insulation of an electrical network with respect to earth, comprising:
    an input circuit comprising a generator capable of applying a reference AC signal of a first frequency to the network to be monitored, the network being of a second frequency higher than said first frequency;
    an electronic detection circuit designed to supply a measurement signal representative of the insulation status of the network in response to the sending of said reference AC signal, said measurement signal being proportional to the ground fault impedance formed by a leakage resistance, and by a leakage capacitance whose value depends on the characteristics of the network;
    means for discriminating the components of said measurement signal, a first component being a function of the current flowing through the leakage resistance, and a second component being a function of the current flowing through the leakage capacitance;
    a synchronous detection device having a pair of first and second static invertors processing the first and second components of the measurement signal, said measurement signal being applied to the input of each invertor via a filtering circuit designed to deliver a filtered signal at the first frequency of the reference AC signal;
    a converter electrically connected to the generator, said converter delivering two quadrature control signals to respectively control the first and second inverters, the first control signal being in phase with said reference AC signal;
    an integrating circuit connected to the output of each of the first and second inverters for extracting the mean value of the first and second components of the measurement signal;
    and computation and display means connected to the outputs of each integrating circuit for indicating the values of the leakage resistance, and/or of the leakage capacitance.

2. The monitoring and measuring device according to claim 1, wherein said filtering circuit cooperates with an amplifier circuit which is arranged to supply two amplified signals of opposite phase, applied respectively to a break contact and a make contact of each inverter.

3. The monitoring and measuring device according to claim 1, wherein the measurement signal is taken at the terminals of a measuring resistance inserted in series with the generator and the ground fault impedance.

4. The monitoring and measuring device according to claim 3, wherein said filtering circuit comprises:
    a first input filter connected to the measuring resistance and having an additional high-frequency sampling control terminal, designed to chop the filtered voltage output from the first filter;

and a second filter capable of eliminating the chopping performed in the first filter, so as to deliver a filtered AC signal, at the first frequency the reference AC signal.

5. The monitoring and measuring device according to claim 1, comprising:

a first excitation toroid surrounding the phase conductors of the network, and having a primary winding connected to the generator, and an auxiliary winding capable of supplying said converter with a phase reference corresponding to the signal actually input to the network by the first toroid;

and a second measuring toroid surrounding the same phase conductors and having a secondary winding which delivers said measurement signal.

* * * * *